(12) United States Patent
Garcia et al.

(10) Patent No.: US 11,769,301 B2
(45) Date of Patent: Sep. 26, 2023

(54) VIRTUAL REALITY SIMULATIONS OF THREE-DIMENSIONAL STRUCTURES

(71) Applicant: Urban District Realty, LLC, Washington, DC (US)

(72) Inventors: Joel P. Garcia, Washington, DC (US); Ryan Fiero, Washington, DC (US)

(73) Assignee: URBAN DISTRICT REALTY, LLC, Washington, DC (US)

( * ) Notice: Subject to any disclaimer, the term of this patent is extended or adjusted under 35 U.S.C. 154(b) by 0 days.

(21) Appl. No.: 17/389,781

(22) Filed: Jul. 30, 2021

(65) Prior Publication Data
US 2022/0036656 A1   Feb. 3, 2022

Related U.S. Application Data

(60) Provisional application No. 63/060,402, filed on Aug. 3, 2020.

(51) Int. Cl.
| | |
|---|---|
| G06T 19/00 | (2011.01) |
| G06T 11/40 | (2006.01) |
| G06T 19/20 | (2011.01) |
| G06F 30/12 | (2020.01) |
| G06F 30/13 | (2020.01) |
| G06T 7/70 | (2017.01) |
| G06V 40/10 | (2022.01) |

(52) U.S. Cl.
CPC ............ *G06T 19/003* (2013.01); *G06F 30/12* (2020.01); *G06F 30/13* (2020.01); *G06T 7/70* (2017.01); *G06T 11/40* (2013.01); *G06T 19/20* (2013.01); *G06V 40/107* (2022.01)

(58) Field of Classification Search
None
See application file for complete search history.

(56) References Cited

U.S. PATENT DOCUMENTS 11,017,611 B1 * 5/2021 Mount .................... G06V 20/20
11,069,145 B1 * 7/2021 Pearson ................ G06T 19/006
(Continued)

*Primary Examiner* — Kee M Tung
*Assistant Examiner* — Jed-Justin Imperial
(74) *Attorney, Agent, or Firm* — Rothwell, Figg, Ernst & Manbeck, P.C.

(57) ABSTRACT

Embodiments disclosed herein mitigate technological and social barriers in navigating virtual reality experiences, and with practical applications for the real estate industry. According to one embodiment, a computer-implemented method for navigating a virtual reality simulation is provided. The method includes generating a virtual reality simulation comprising a plurality of virtual spaces. The method includes rendering, in a display of a user device, a first virtual space in the virtual reality simulation, the first virtual space comprising a digital model comprising a plurality of selectable regions, wherein each selectable region is associated with a physical location within a three-dimensional structure. The method includes obtaining an input from a user, the input indicating a selection of a first region of the plurality of selectable regions of the digital model. The method includes in response to the input, rendering, in the display of the user device, a second virtual space in the virtual reality simulation, the second virtual space comprising a physical location in the three-dimensional structure associated with the selected first region.

17 Claims, 11 Drawing Sheets

(56) References Cited

U.S. PATENT DOCUMENTS

| | | | |
|---|---|---|---|
| 2018/0005429 A1* | 1/2018 | Osman | A63F 13/56 |
| 2019/0050502 A1* | 2/2019 | Santarone | G06F 30/13 |
| 2019/0325633 A1* | 10/2019 | Miller, IV | G06T 13/40 |
| 2020/0329214 A1* | 10/2020 | Ahn | G06F 3/017 |
| 2021/0368064 A1* | 11/2021 | Aggarwal | H04N 1/3872 |

* cited by examiner

VIRTUAL REALITY SIMULATIONS OF THREE-DIMENSIONAL STRUCTURES

CROSS-REFERENCE TO RELATED APPLICATIONS

This application is a non-provisional of, and claims the priority benefit of, U.S. Prov. Pat. App. No. 63/060,402 filed Aug. 3, 2020, which is hereby incorporated by reference in its entirety.

TECHNICAL FIELD

Embodiments disclosed herein relate generally to systems, methods, and computer program products for creation and navigation of virtual reality structures. Embodiments disclosed herein may be suitable for applications in the real estate industry, primarily in sales situations, though possibly also as an aid to construction, design, and home staging.

BACKGROUND

Three-dimensional (3D) modelling may allow for the creation of virtual spaces; these spaces can be artistic fabrications or realistic renderings of actual locations. Such 3D models are commonly used in real estate markets and are critical in situations where a property is under construction and is unsuitable for photos.

Modern virtual reality technology can use 3D models to give a user the feeling of being in a space. In the case of real estate property models, users can experience simulations of standing in spaces they are considering buying. The value of this has been widely noted, with many companies offering some semblance of virtual reality (VR) real estate showings.

Companies such as Zillow offer 360 photo viewings, which can be experienced with or without VR hardware. These typically do not leverage full 3D models of the space.

Some companies that specialize in creating 3D models, either by artists' hands (TheBDX, Spine3D), or through photogrammetry (Matterport), offer some VR experience, typically a simple navigation system to reposition the user in virtual space.

A dedicated VR company, Atlas Bay VR, implements a high-end solution that allows a user to physically walk around the space and use position-tracked wands to select user interface elements that change paint colors and open and close doors.

These solutions appeal to daring, technically inclined users. None acknowledge the many homebuyers who are unfamiliar with VR and are put off by the thought of learning to navigate a new technological device.

The industry acknowledges the value of these technological advances; 360 photo viewers have become ubiquitous in the real estate industry. However, a true, curated, accessible VR solution is still out of reach.

SUMMARY

Accordingly, there is a need for systems, methods, and computer program products that place multiple people in the same virtual space using VR hardware, and distributes the burden of control to ensure targeted users have no responsibilities beyond wearing a VR headset. Content shown to targeted users may be intentionally limited, ranging from a full journey to different manipulatable virtual environments, down to a stimulus free expanse to decompress. Non-VR computers may be included to accommodate additional participants who cannot or do not wish to be in the virtual space, and to provide additional processing power to augment the capabilities of the VR equipment.

According to one aspect, a computer-implemented method for navigating a virtual reality simulation is provided. The method includes generating a virtual reality simulation comprising a plurality of virtual spaces. The method includes rendering, in a display of a user device, a first virtual space in the virtual reality simulation, the first virtual space comprising a digital model comprising a plurality of selectable regions, wherein each selectable region is associated with a physical location within a three-dimensional structure. The method includes obtaining an input from a user, the input indicating a selection of a first region of the plurality of selectable regions of the digital model. The method includes in response to the input, rendering, in the display of the user device, a second virtual space in the virtual reality simulation, the second virtual space comprising a physical location in the three-dimensional structure associated with the selected first region.

According to another aspect, a non-transitory computer readable medium storing instructions is provided. The instructions are configured to cause a computer to generate a virtual reality simulation comprising a plurality of virtual spaces. The instructions are configured to cause the computer to render, in a display of a user device, a first virtual space in the virtual reality simulation, the first virtual space comprising a digital model comprising a plurality of selectable regions, wherein each selectable region is associated with a physical location within a three-dimensional structure. The instructions are configured to cause a computer to obtain an input from a user, the input indicating a selection of a first region of the plurality of selectable regions of the digital model. The instructions are configured to cause a computer to, in response to the input, render, in the display of the user device, a second virtual space in the virtual reality simulation, the second virtual space comprising a physical location in the three-dimensional structure associated with the selected first region.

In yet another aspect, a system comprising a processor and a non-transitory computer readable memory coupled to the processor is provided. The processor is configured to generate a virtual reality simulation comprising a plurality of virtual spaces. The processor is configured to render, in a display of a user device, a first virtual space in the virtual reality simulation, the first virtual space comprising a digital model comprising a plurality of selectable regions, wherein each selectable region is associated with a physical location within a three-dimensional structure. The processor is configured to obtain an input from a user, the input indicating a selection of a first region of the plurality of selectable regions of the digital model. The processor is configured to, n response to the input, render, in the display of the user device, a second virtual space in the virtual reality simulation, the second virtual space comprising a physical location in the three-dimensional structure associated with the selected first region.

BRIEF DESCRIPTION OF THE DRAWINGS

The accompanying drawings, which are incorporated herein and form part of the specification, illustrate various embodiments.

DETAILED DESCRIPTION

Figure 1:
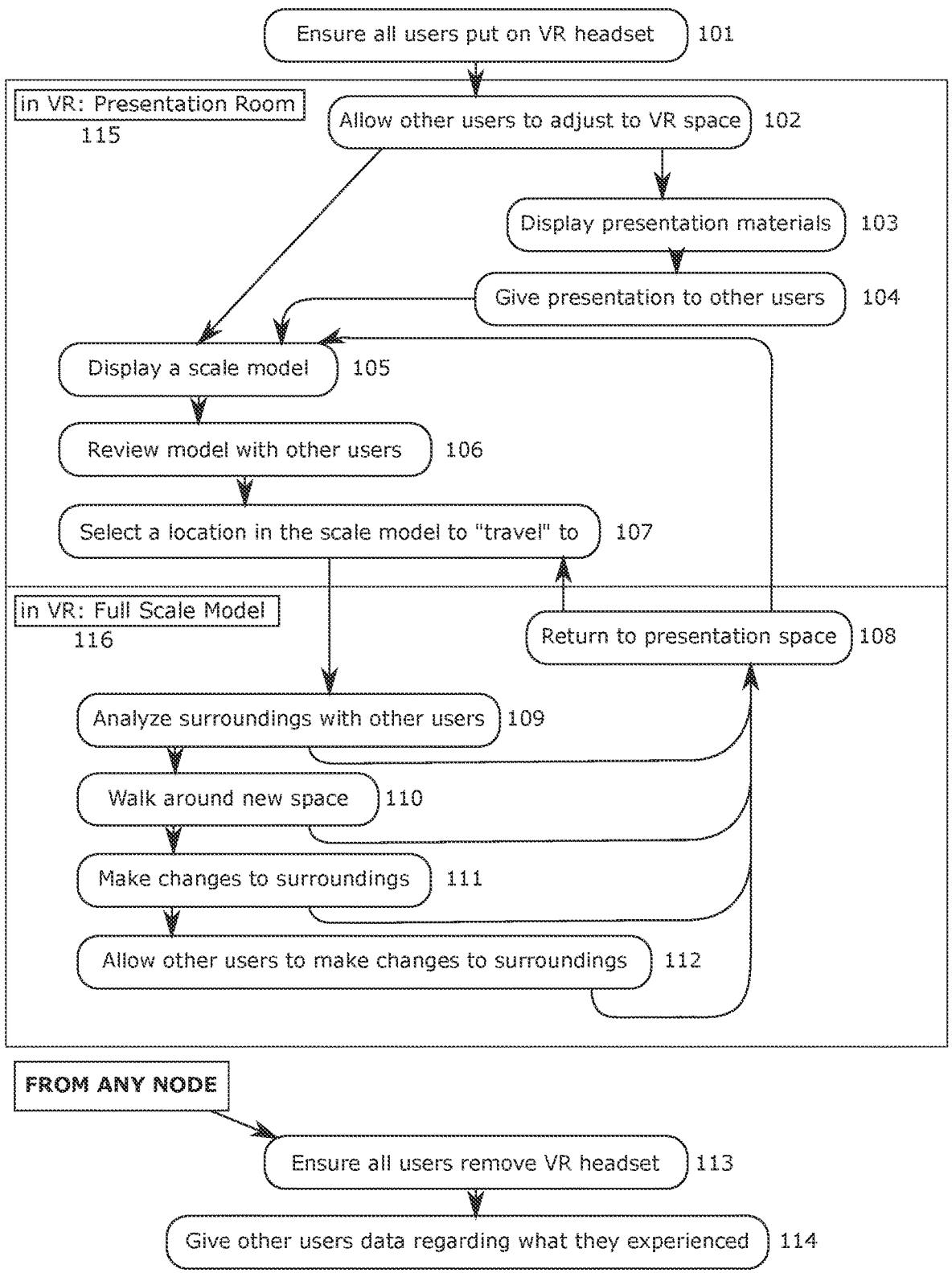
FIG. 1 is a flow diagram of a VR experience, according to some embodiments.

According to some embodiments, a personalized connection creating visual representations of all other users in each user's virtual world is provided. These representations use absolute position data to ensure that users who share a physical space maintain that spatial relationship in virtual space. Hand data is transmitted to allow users to see each other's gestures.

The control system consists of gestures detected by hand tracking, designed to be simple enough not to distract users who have not learned the system.

Upon starting the experience, users will find themselves in the "Presentation Room," a space designed to be calming and relatively stimulus free, such as a grassy field with a blue sky or a medium gray expanse with stars in the distance. A user with control privileges can add or remove elements, such as a slideshow screen, diorama, or video screen. These elements may include objects that are only visible to users with control privileges, such as a teleprompter.

The Presentation Room serves as a hub, as users can display scale models of potential virtual environments, cycle through options, and "teleport" the group to the corresponding point in the virtual location. Users can return to the Presentation Room to select a different location, teleport to a new position in the same location, or reorient the environment so that they can return to the virtual space in the same position but with a different orientation. With this feature, users can walk back and forth in a limited real space while their movement is interpreted as consistent movement in the same direction in virtual space.

Some virtual spaces may have alternate forms or versions, such as a furnished and unfurnished version, or a nighttime look and a daytime look. The settings that dictate which form is visible can be manipulated through the menu. These settings may be considered universal among users, so that when an option is selected from the menu, a signal is sent to all connected devices so they all reflect the new setting.

Additionally, the menu may contain a list of objects and finishes in the virtual world that the users occupy at the time. By selecting an item from this list, a user may see a panel allowing customization options including recoloring, resizing, or moving the selected object. The list could also allow the user to add objects, remove objects, or exchange objects. Customization panels may be initially populated with alternate design choices built into the model file by the original model designers, but may include access to a full catalog of possible finishes and furnishings.

In situations where users want more control over design of the virtual space, a catalog of available furnishings can be populated with real life items, done in partnership with suppliers who provide data on dimensions, pricing, and availability. This ensures that design choices users make in virtual space are executable in real life.

According to some embodiments, at least two virtual reality headsets are connected through a server. Non-VR devices may also be connected to the server, and these non-VR "terminals" have no representation in the virtual space, but display virtual representations of the users in the virtual space. This allows additional participants to observe the experience without wearing headsets.

Additionally, in situations where a terminal is running on a powerful computer, it can process data to send to lesser-powered headsets. For example, if a user in a headset attempts to capture a "photo" in the virtual space, that gesture can send a signal to the terminal identifying the angle and extents that the user wants to capture. The terminal can then render the specified section of the model and stream the final image data back to the headset.

Upon conclusion of the experience, users may desire a referenceable account of acquired data, such as information on viewed properties, selected paint colors, furniture vendor information, or captured "photos." These could be aggregated into a document that could be sent electronically or printed on site.

VR Experience Overview

FIG. 1 is a flow diagram of a VR experience, according to some embodiments. At step 101, users put on virtual reality headsets running software connected to a server. They find themselves in a virtual environment created in the game engine designed to be a soothing open space, referred to here as the "Presentation Room" (element 115). At step 102, since some users may be unfamiliar with VR or the software, users may be given time to adjust to the experience. At step 103, if a user has prepared a presentation for the other users, that user may use a menu to cause a preloaded slideshow, diorama, or video to appear in all users' displays. At step 104, the presentation may be shown to other users within the virtual space, which they may then discuss in the virtual space. At step 105, when the users are prepared to move on to one of the alternate preloaded environments, a user may bring up a scale model of that environment. The scale model, described in further detail below, may be the actual environment model scaled down through the rendering engine or a prepared companion model designed to be easier to analyze or simpler for the engine to render. At step 106, the users may then analyze the scale model. According to some embodiments, users may view the scale model, and interact with it, as described in further detail below. At step 107, the users may decide to replace a model with a different available scale model or transition from the "Presentation Room" into the full environment represented by the model. At step 107, a user can select a location in the scale model to travel to. Upon selecting a point in the scale model, a user would cause their screen to transition from the Presentation Room to a location in the scale model. The transition may be, for example, the screen fading to black or to a loading screen. In response to the selection of a location in the scale model, the full environment model would be loaded and positioned such that the point in the full model correlating to the designated point in the scale model is centered between users with VR headsets. In some embodiments, the user's screen may transition into the new environment, such as through a fading effect. Data would be relayed through the server to the other users to cause their terminals and/or VR headsets to recreate that sequence of events. The users would then find themselves in the full scale model environment (116). At step 109, multiple users may be present in the full scale model environment (116) so that they can analyze their perceived surroundings. At step 110, users with VR headsets may be able to physically walk around the full scale model environment (116) in order to view the space from different perspectives thanks to the tracking hardware. At step 111, users may be able to enact changes in the environment (116) through the menu system such as adding and removing props and furniture in the space or changing the colors and patterns of elements in the environment. At step 112, users familiar with in-simulation navigation controls may be able to share a single menu panel that allows other users to change an individual element by selecting from a small set of options. At step 108, at any time, a user can initiate a transition back to the "Presentation Room." From the Presentation Room, a user may reenter the full scale model environment (116) in a different position or orientation or select a different virtual environment to explore. At step 113, when the users wish to leave the virtual experience, they can remove their headsets. At this point, at step 114, data regarding the environments they viewed, the selections they made, and any elements they responded strongly to may be aggregated and given to them, possibly as an email or hard copy.

Physical Environment

Figure 2:
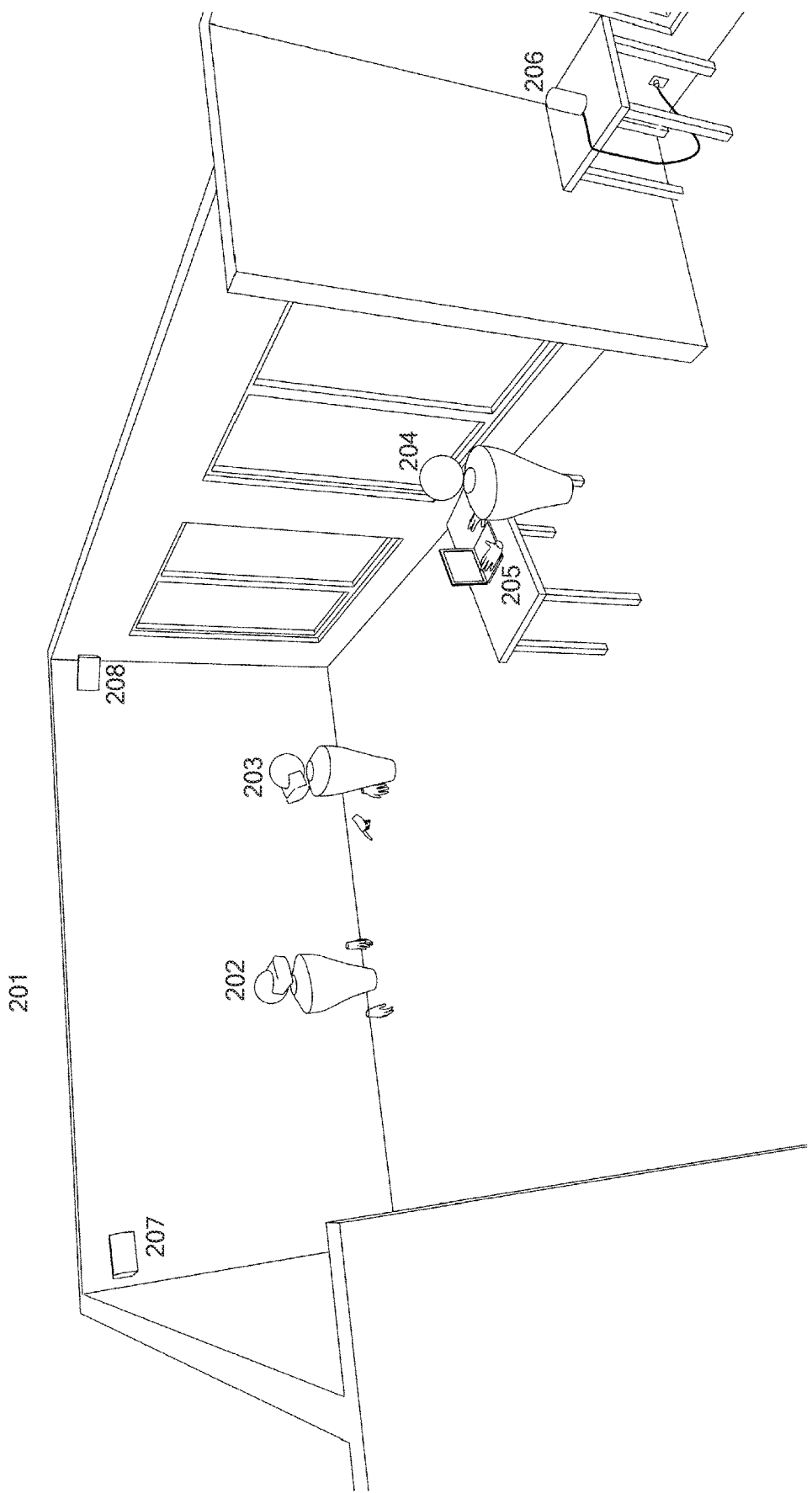
FIG. 2 is a diagram of a physical environment, according to some embodiments.

FIG. 2 is a diagram of a physical environment (201), according to some embodiments. According to some embodiments, the physical environment 201 may be a guided virtual reality real-estate showcase. The physical environment 201 may be a containing physical space with room for users to walk around unobstructed. Users 202 and 203 may be equipped with hardware with the following capabilities: a virtual reality display, position and orientation tracking for a user's head, hands, and fingers. The hardware may be connected to a computer capable of running client software locally, or running the client software from a remote server (not shown).

A virtual reality display may include a wearable video output device capable of displaying video images that can respond to changes in position and orientation at a high enough frame rate to give the wearer the sensation of moving around a virtual space. Position and orientation tracking may include devices that can provide data regarding a target object's orientation and position in relation to the pull of gravity, the topological features of the containing space, and the position of the hardware when the tracking was initiated (such tracking is often referred to in the field as 6 Degrees of Freedom, or 6 DoF.) According to some embodiments, the Oculus Quest VR headset may be a suitable virtual reality display with built-in head, hand, and finger tracking, as well as an on-board computer that can connect to a wireless network, although the embodiments disclosed herein are not limited to the Oculus Quest VR hardware.

The system may include additional participants as shown at 204, either with additional headset hardware, or on a computer with a standard screen as shown at 205. These non-VR screens will be referred to as "terminals," which do not need tracking capabilities, but are powered by computers running software that can communicate with other hardware over a network.

All virtual reality hardware and terminals must be able to connect to a remote server or servers. Connections can run through a router as shown at 206, through ad-hoc or similar peer-to-peer connections, or through a loopback connection if the server is running alongside client software on one of the devices. In the embodiment shown in FIG. 1, the terminal shown at 205 may be running server and client software. In this embodiment, the system is running over a local area network and does not require access to the internet.

The physical environment 201 room may also contain speakers as shown at 207 and 208, fans, scent emitting devices, or other devices to enhance the users' experiences. These devices may be controlled through the network, either directly or by interfacing with another connected device such as a terminal.

The simulation software can run in a game engine, such as Unity. These engines create and track "objects" in 3D space, which may contain executable scripts or references to externally created 3D model files and 2D texture (image) files. Objects that reference 3D models are then rendered to the screen by the game engine. This allows a programmer to "create" and "destroy" objects in a displayed virtual world. 3D model objects may include a large containing environment, smaller objects that populate that environment, and visual representations of characters playing the game. A "camera" object determines the viewpoint from which the 3D models are visualized.

According to some embodiments, the game engine may further include a physics engine that provides a simulation of certain physical systems present in the real world. In some embodiments, the 3D model object (e.g., a scale model of a physical structure) may be defined as having a plurality of regions defined as a physics object and correlated to a physical location (e.g., a specific room in a housing structure). According to some embodiments, when a user performs a physics interaction with a defined physics region in the virtual simulation (e.g., the user's hand touches or selects a physics region defined in a scale model), the VR system or server may associate that physics region with a real-world physical location and transport the user to the selected location.

Clients connected to virtual reality headsets may use information from head tracking hardware to position the virtual "camera". Typically that data is made available through a Software Development Kit (SDK) provided by the manufacturer of the tracking hardware, such as Oculus's Quest SDK. Such SDKs often contain direct integration with a game engine to create a head tracked in-game camera that defines the virtual reality experience.

All tracked elements may share an absolute reference position and orientation in the real world. This may not be reliably extrapolated from built in SDK solutions; e.g., such as in situations where a user removes a headset, walks to a different location, and then puts the headset back on, built-in software may reposition the virtual world such that the user appears to be in the same virtual location that they were when they removed the headset. To maintain a consistent position, all software may be initialized in the same location and orientation in the containing room. Upon initialization, the software can access static position markers (derived from the real world rather than the virtual world) exposed by the tracking hardware SDK, such as the Quest SDK's Guardian Boundary system. The position and orientation of the headset in relation to the static markers can be stored in software as an "anchor" position. When a user puts on the headset (which the SDK exposes as an event trigger) the software can recalculate where the anchor should be in regards to the static marker, and if the anchor object is not there, then the SDK has repositioned the virtual world. The software then moves the virtual world so that it realigns with the original position. This can be done before anything is displayed in the headset so the user does not see the repositioning.

Clients 202, 203, connected to hand tracking hardware may also receive hand and finger positioning data. The Oculus Quest SDK exposes this data as three numbers for position (X, Y, and Z) and a four number quaternion for rotation (X, Y, Z, and W) for each hand and each joint of each finger. This can be used to position a visual representation of the user's hands in 3D space. This allows a user to see their hands in the virtual world without holding any controller or wearing any gloves. In situations where one or both hands cannot be confidently tracked, the corresponding models can be hidden or fade out in the virtual world.

Client software can connect to an instance of server software. This connection can be made with the User Datagram Protocol (UDP). To send data, the client and server send data packets to each other's IP address. In order to discover relevant IP addresses, the server can use UDP's broadcast system to send a message to all devices connected to the local network; client software can listen for these messages and use them to initiate a connection back to the server.

In-Simulation Assets 3D environment models may be stored as data regarding the extents of a containing space. The data may be manually entered into software or procedurally gathered through analysis of a 2D or 3D architectural drawing. The data may be used to create a 3D model of a standard type, such as in Filmbox .fbx (FBX) format. This may be generated at simulation runtime or baked and stored as a standard model.

This space data may consist of a collection of surfaces, edges, and edge endpoints. Surface data consists of a reference to all adjacent edges and the normal of the surface, defined as the line perpendicular to the surface plan with directionality pointing into the space. Edge data consists of references to the endpoints at either end and the two surfaces that meet at that edge. Endpoint data consists of a position in 3D space and a list of any edges that end at that point.

Simple rooms can be created by defining a floor surface and extruding the edges up to the height of the room. Here "extrusion" refers to making copies of edges and their endpoints, where new edges are created linking each new endpoint to its original reference and new surfaces are created linking each new edge to its original reference and the edges created between their endpoints. More complex rooms can be achieved by converting a 3D model with vertices, edges, and faces (such as can be generated in an external 3D modelling program) to surfaces, edges, and endpoints. Surfaces with a normal pointing directly up would be designated "floor" surfaces. Surfaces with a normal pointing down would be designated "ceiling" surfaces. Other surfaces in the room would be designated "walls."

By specifying a position and size for a door or window opening in regards to the 2D surface of a wall, the surface may be cut into multiple coplanar surfaces that line up with the desired opening by cutting and adding edges. When the desired opening is represented by a single surface, the surface is deleted. New surfaces may be added to simulate the depth of the wall by extruding the edges of the deleted surface into the wall. These surfaces created by extrusion are designated as "door" or "window" surfaces if their normal does not point up, and "threshold" or "windowsill" surfaces if their normal does point up.

Extruding an opening in a wall may create "hanging" edges, edges that border only one surface. If an additional room is created with a surface that may represent the other side of the wall (as determined by distance between the two surfaces and an inverse normal,) the new room may be assumed to have a matching door opening, which can be constructed in the same manner, except that instead of extruding into the opening, the edges of the opening are merged with the "hanging" edges off of the previous room.

This representation of a space may be used as a basis for generating a 3D visualization of moulding and trim work in a standard face/edge/vertex format. Every edge in the model may be marked for a specific type of moulding according to the designation of the neighboring surfaces, e.g.:

If the edge does not have two neighboring surfaces, the edge is marked empty.

If no neighboring surfaces are "walls," the edge is marked empty.

If both neighboring surfaces are "walls," the edge is marked empty.

If the edge represents the intersection of a "wall" and "ceiling," the edge is marked for crown moulding.

If the edge represents the intersection of a "wall" and "floor," the edge is marked for baseboard.

If the edge represents the intersection of a "wall" and "door," the edge is marked for door casing.

"Wall" surfaces and "threshold" surfaces should not intersect in most cases, and are ignored if they do.

If the edge represents the intersection of a "wall" and "window" the edge is marked for window casing.

If the edge represents the intersection of a "wall" and "windowsill," the edge is marked for a window sill.

Two edges may be considered "contiguous" if they share an endpoint and a moulding designation other than "empty." Specific moulding profiles may be assigned per individual edge or to a chain of contiguous edges.

Figure 3C:
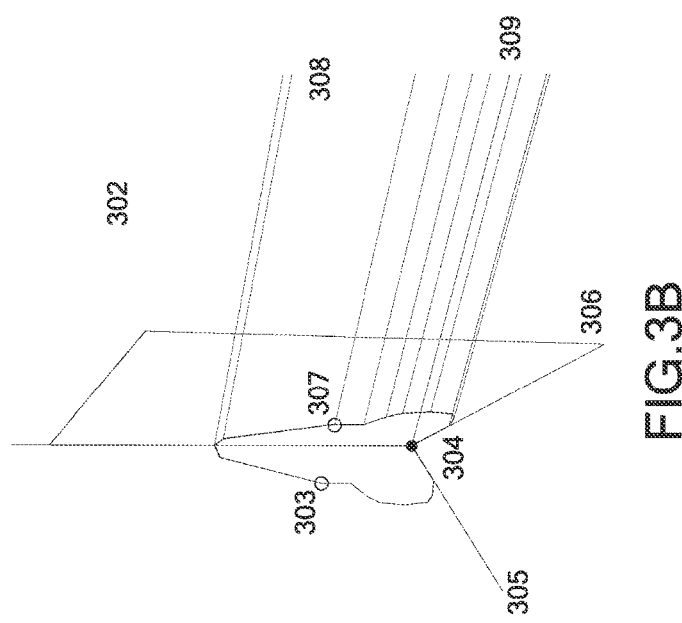
FIGS. 3A-3C depict the creation of a 3D presentation of moulding, according to some embodiments.
Figure 3A:
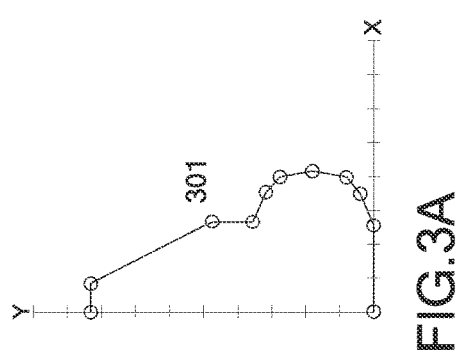
Figure 3B:
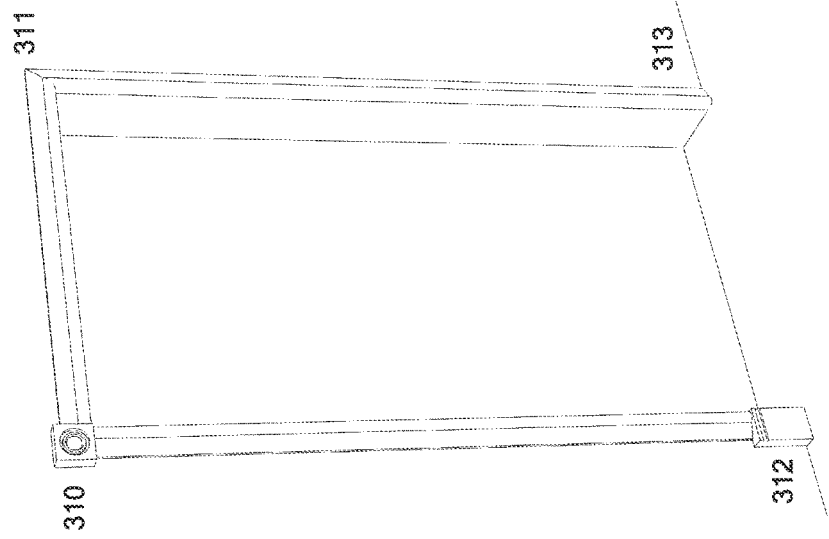

FIGS. 3A-3B depict the creation of a 3D presentation of moulding, according to some embodiments.

FIG. 3A depicts a moulding profile, according to some embodiments. Moulding profiles may be represented as a list of vertices connected by edges in a two dimensional XY space, as shown generally in FIG. 3A. For each edge marked for moulding, two instances of the moulding profile may be created, one at each edge endpoint, where a vertex in the profile at (0,0) would be placed directly on the endpoint.

FIG. 3B depicts an edge at 309 that is defined by the endpoint at 304. Vertex X and Y values are then interpreted according to the edge's connected "wall" surface (302), with the X axis representing movement along the surface's normal ("away" from the wall) and the Y axis representing movement along the axis perpendicular to the surface's normal and the edge's direction, with positive values moving towards the center of the wall. The vertex 301 in FIG. 3A can be seen repositioned at 303 in FIG. 3B. The two moulding profiles are then filled in with faces as though one was extruded to create the other, as shown at 308.

The positions of these vertices may be modified at intersections of contiguous edges to create a traditional moulding miter. Given the edge endpoints A, B, and C, where an edge exists between A and B and an edge exists between B and C and the two edges are considered contiguous, the miter will fall on a plane that passes through point B. The normal of the plane can be found by adding edge directions A to B (B−A) and B to C (C−B) together (in which all directions are assumed to be normalized). For any vertex V in the moulding profile from edge AB We can move it in the direction B−A until it intersects the miter plane, by the formula ((B−V)·planeNormal)/((B−A)·planNormal). Given that the two edges have matching moulding profiles and the miter plane evenly splits the edges, the moulding vertices on edge BC can be positioned to match the correlated vertices on edge AB without recalculations.

A visualization of this can be seen in FIG. 3B, where edges 305 and 309 are considered contiguous at endpoint 304. The miter plane is shown at 306. Edge 309 has a copy of the moulding profile at the endpoint, shown at 303. The vertices are projected onto the miter plane in the direction of the edge, moving the profile to the location shown at 307.

Certain mouldings may include special features at endpoints and corners, such as plinth blocks and rosettes. These would be supplied as modelled 3D representations, with a Y value representing "up" in the room, the X value representing "out" along the wall surface normal, and Z representing the axis perpendicular to those two. Endpoint features may be applied at edge endpoints with no contiguous edge. Corner features may be applied at the point between two contiguous edges and have restrictions to the positions in which they are applied, such as whether or not the moulding on the two edges are coplanar, whether the created corner is convex or concave, and/or whether the edges meet at a certain angle. The software may calculate the size of these features and use that information to align them with the edge endpoints and shift the moulding profile accordingly.

FIG. 3C displays four different methods of resolving moulding at an endpoint, according to some embodiments. A rosette joining two contiguous edges is shown at 310. A miter joining two contiguous edges is shown at 311. A plinth block resolving an endpoint that has no joining contiguous edge is shown at 312. A standard moulding profile resolving an endpoint that has no joining contiguous edge is shown at 313.

Mouldings may be applied according to a specified hierarchy, so that if two different moulding profiles would intersect, the vertices in one may be pulled back along its edge according to the size of the other.

Doors, windows, and trim such as slam strips may be inserted in corresponding openings in the walls. These elements could be 3D models with specified "stretch" points in the three axes and a single "anchor" value in each axis. Software could resize these elements around these stretch points, ensuring vertices that are not divided by a stretch point are moved rather than scaled. To resize an element with n stretch points by an amount d, each vertex would move along that axis away from the anchor point in the amount d*i/n, where i represents the number of stretch points between the vertex and the anchor point. In situations where the anchor point is directly on a stretch point, that formula is replaced with d*i/(n+1), where i is calculated inclusively of the stretch point on the anchor.

The software can add UV information to vertices in the model to allow textures to be applied consistently. UV information may refer to fourth and fifth value stored for every vertex in a 3D model, along with their position in 3D space (X, Y, and Z). Standard 2D images (called "textures") are commonly painted onto the surfaces in a 3D model. These values, which may typically be represented as percentages so that they apply equivalently to textures of differing resolutions, may be used the render engine to determine where each surface in the model should "line up" with the 2D texture. These can be generated by incrementing UV values a consistent ratio according to the distances between vertices in 3D space. When possible, UVs can maintain consistent orientation per the 3D axes; for example, +V could relate to +Y and +U could relate to +X, except in cases when the 3D surface normal aligned with the Y or X axis, in which case the missing axis could be substituted for +Z.

Space data can also be used to create alternate variations of the model designed for viewing at small scale. These variations could include models without ceiling surfaces, with wall heights capped at a low level, with simpler moulding, and/or with no moulding at all.

Simulator software may also include models created through traditional 3D modelling software or models created based on real world locations secret through photogrammetry.

Virtual space data may be "staged" by adding and positioning models and materials. These models may include furniture and hardware files as 3D models, and finishes and treatments as color information or 2D textures. These elements may be created in collaboration with real world suppliers of these products so that objects in the virtual world represent things that are attainable in the real world. These visual representations may be linked to data regarding vendors, pricing, and availability.

Staging data may be baked into a model by adding copies of referenced models and textures or retained as links to external files. Staging data may include a primary set of models and textures and alternate sets of models and textures. These alternate sets may not be displayed with the data but stored as suggestions that can be viewed at runtime in place of the primary set. Alternate sets may be listed as complete alternate stagings or as alternate options for a specific object.

Data Flow

Figure 4:
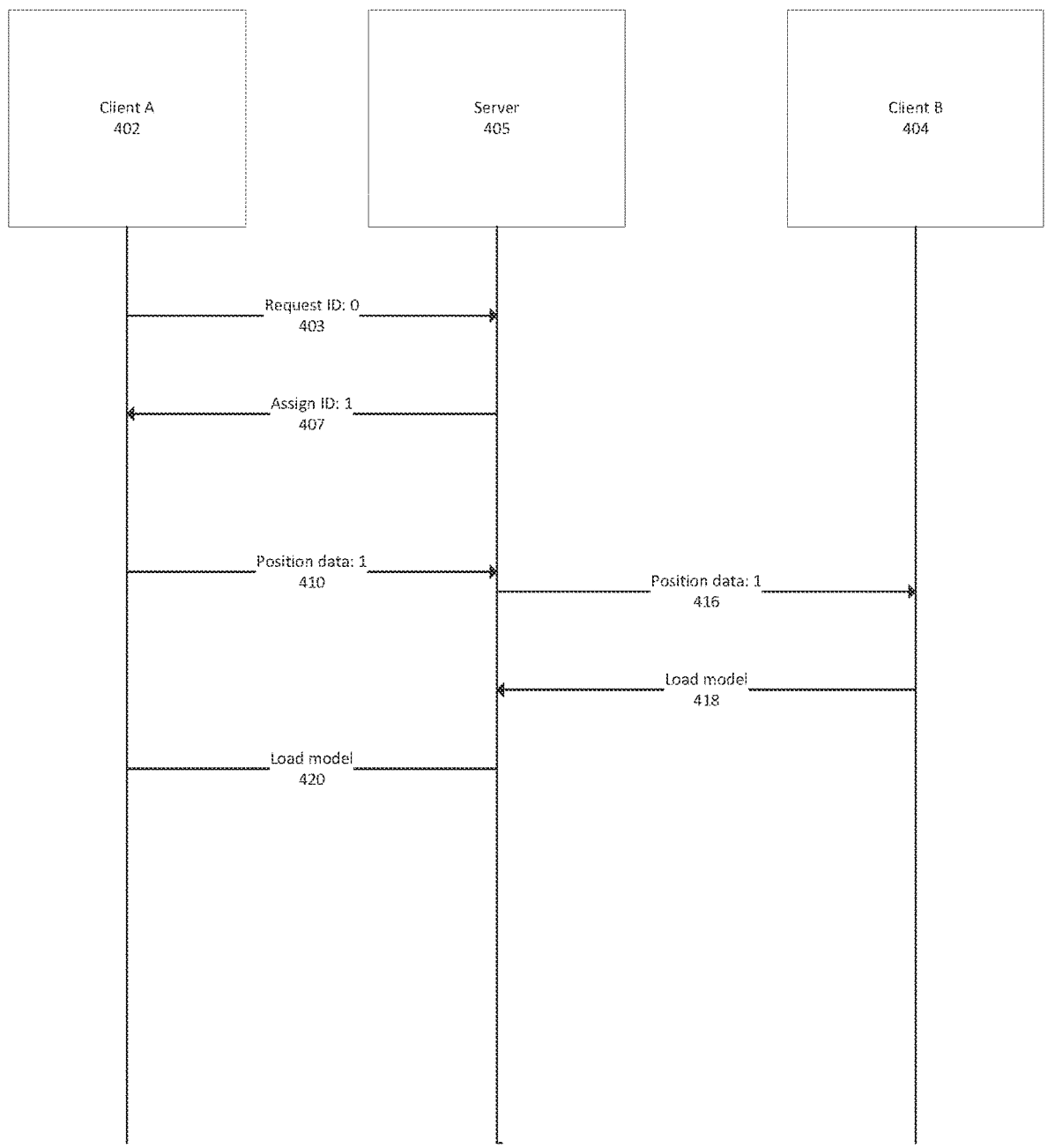
FIG. 4 is a data flow diagram, according to some embodiments.

FIG. 4 is a data flow diagram, according to some embodiments. FIG. 4 generally shows data travelling to and from the clients (such as headsets and/or terminals) and server. Upon connection to a server, a first client (Client A 402) sends a message 403 to the server 405 for a unique ID. If the client has not previously made a connection, the client may include a designated "empty" number, such as 0 in the message 403. The server assigns a unique ID to the requesting client (402), and transmits a message 407 comprising the assigned unique ID to the client (402). According to some embodiments, the server 405 may assign a unique ID and then increment an internal value so that the ID will not be assigned again. Upon receipt of message 407 containing an assigned unique ID, the client (402) stores this unique ID as an identifier.

Once connected, the client uses this ID to "stamp" additional messages that it sends to the server. For example, the client (402) may periodically send messages 410 to the server 405 with position data for the client (402), and these messages may further include the client's unique identifier. The server may then send a message 416 to all other connected clients, such as Client B (404), the first client's (402) position information. Message 416 may further include the unique identifier of the client associated with the position information in message 416. The server 405 and/or other clients (404) can use the ID "stamp" to determine which client is associated with the positioning data.

The position data may be used to allow clients to display visualizations of other users and their actions in the VR environments disclosed here. Clients with access to tracking information may broadcast position and orientation data of a user's head and hands at regular intervals. Other clients can use this data to create visual representations of that user in virtual space. Clients may use the provided ID to differentiate between users, such as tinting representations of other users different colors based on the ID of the received data.

Position and orientation data may not be received at the full framerate that a client uses to update an attached display. In order to avoid displaying sudden jerky motions, clients may interpolate the visual representations to new positions over time or use past data to extrapolate a velocity which can be applied when current data is not available. Additionally, all visual representations of other users may be linked to a timer that tracks the time since the last update so that the representation can be faded out when the client does not have reliable data on the user's position.

Any data regarding a visible element of the virtual world may be broadcast to other clients. If a user opens a virtual menu panel, their client may broadcast that data so that other clients can create a visible representation of that menu panel. If a user initiates a change in the state of the simulation, such as loading a new environment or turning on a light, their client may broadcast that data so that all clients mirror that change as shown in.

Non-VR terminal devices may not be visually represented in the virtual space, and may not broadcast data regarding user position or menu interaction states. Terminals may receive data and use it to display representations of other users. Terminals may initiate changes in the state of the simulation, which may include broadcasting that data so that other clients make the same change.

For example, if client B elects to load a model, or navigate from the Presentation Room to a model virtual environment, a message 418 comprising the command may be sent to server 405, and the server 405 may in turn transmit a message 420 to other clients (e.g., Client A 402) with an instruction to load the model.

While FIG. 4 illustrates communication between clients and a server, in some embodiments the messages may be transmitted in a more distributed fashion directly amongst clients, and/or clients implementing both client and server software, without the need to go through a central server node.

In situations where a tracking SDK provides robust finger tracking data, simplifying that data can reduce network traffic and simplify the process of detecting hand gestures. Finger position data can be ignored, as the position of each joint can be extrapolated based on the rotation of the previous joint and the position and rotation of the root hand object.

Figure 5:
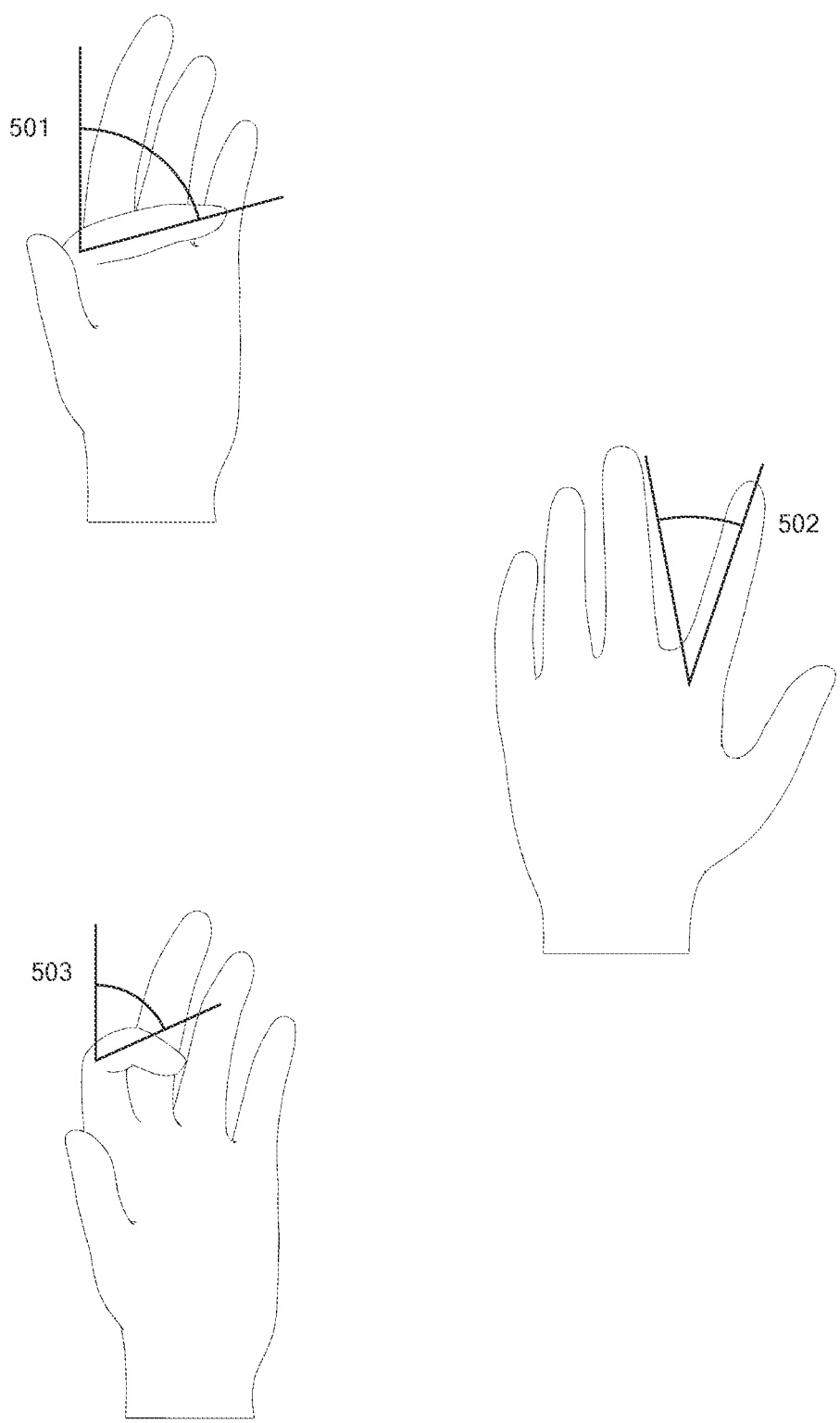
FIG. 5 shows gesture commands for a virtual reality space, according to some embodiments.

FIG. 5 shows gesture commands for a virtual reality space, according to some embodiments. FIG. 5 generally shows basic finger motions that can be recorded to allow a reasonable approximation of a hand's finger pose. Each finger's first segment rotation can be expressed as an Euler rotation derived from the local coordinate system of the joint, such that X represents motion towards the palm as shown in 501 ("folding"), Y represents side to side motion as shown in 502 ("wiggling"), and Z represents rotation along the axis running through the finger segment, which is extremely limited in most humans and can be disregarded. The second and third segments in each finger are limited to rotation on the X axis as shown in 503 ("curling"), and in most situations the two segments are coupled such that the third segment's rotation can be extrapolated by multiplying the second segment's rotation by a set ratio of around 50%. This reduces each finger's data to three values: "fold", "wiggle", and "curl". When expressed in degrees, these values typically fall within a range of −40 to 120, allowing them to each be represented by a single byte (256 values) while maintaining single degree precision. This represents a hand's finger pose in 15 bytes, down from the 424 bytes required to represent every joint's position and rotation as floating point numbers.

Absolute Positioning in the Space

Because all tracking devices may be calibrated in reference to the same point in real space, users in VR headsets see virtual representations of each other in positions that reflect their position in real space.

Figure 6A:
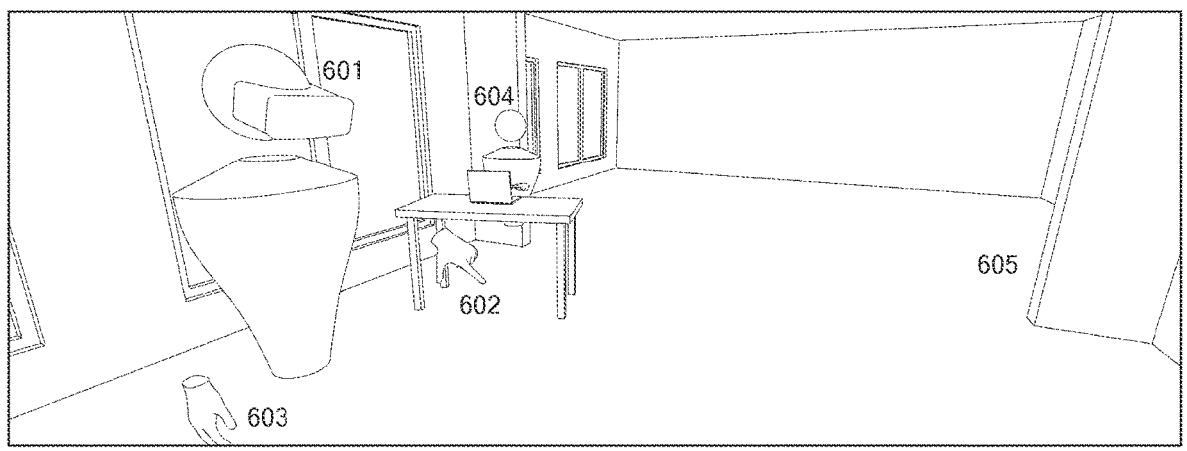
FIG. 6A is an illustration of a VR physical world viewpoint, according to some embodiments.

FIG. 6A is an illustration of a VR physical world viewpoint, according to some embodiments. FIG. 6A shows a user's VR viewpoint 605 in the real world environment (e.g., corresponding to 201 of FIG. 2). There may be a second user, and the VR space may depict the second user with a headset (601), the second user's hands (602 and 603). There may be a third user (using a terminal), and the terminal user may be depicted as a FIG. 604 interacting with a traditional laptop running client software. Topological features of the containing space can be seen in the background, such as walls, windows, doors, and the like.

Figure 6B:
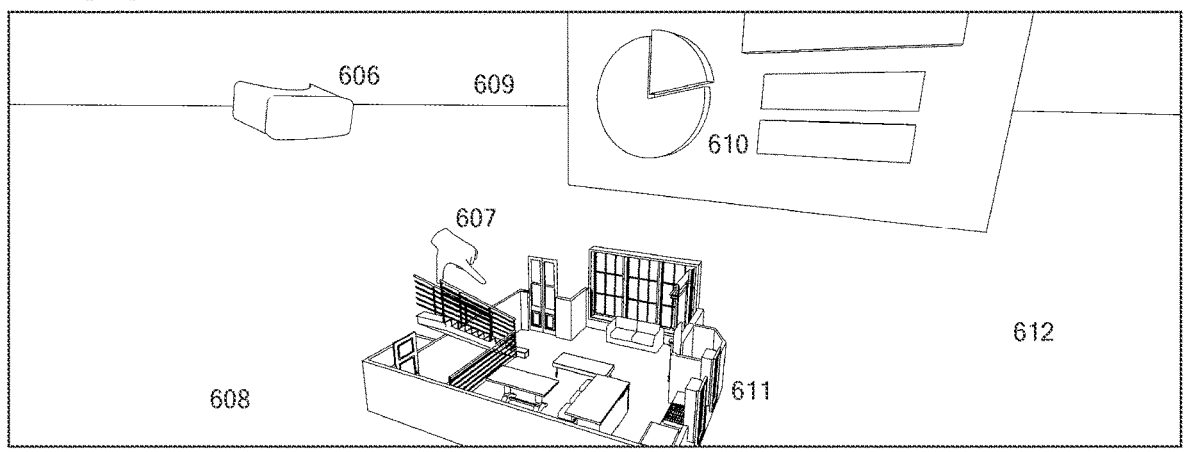
FIG. 6B is an illustration of a VR Presentation Room viewpoint, according to some embodiments.

FIG. 6B is an illustration of a VR Presentation Room viewpoint 612, according to some embodiments. In FIG. 6B, a user wearing a virtual reality headset may see 3D models displayed on the screen through a rendering engine. The other user wearing a headset is represented in the virtual world in the same position that they occupy in the real world, and may be depicted as a headset (606) and corresponding hand(s) 607. When successfully tracked, the other user's hand is represented in the virtual world in the same position and with approximately the same finger orientation as in the real world (607). If the other user's headset is not sending data for a hand, the hand is not drawn in the observer's headset (608). Clients running on non-VR hardware send no position data and may have no visual representation in the virtual world (609).

VR Presentation Room Viewpoint 612 may depict one or more models 611 of a physical structure and/or a presentation 610, as described in further detail herein.

Figure 6C:
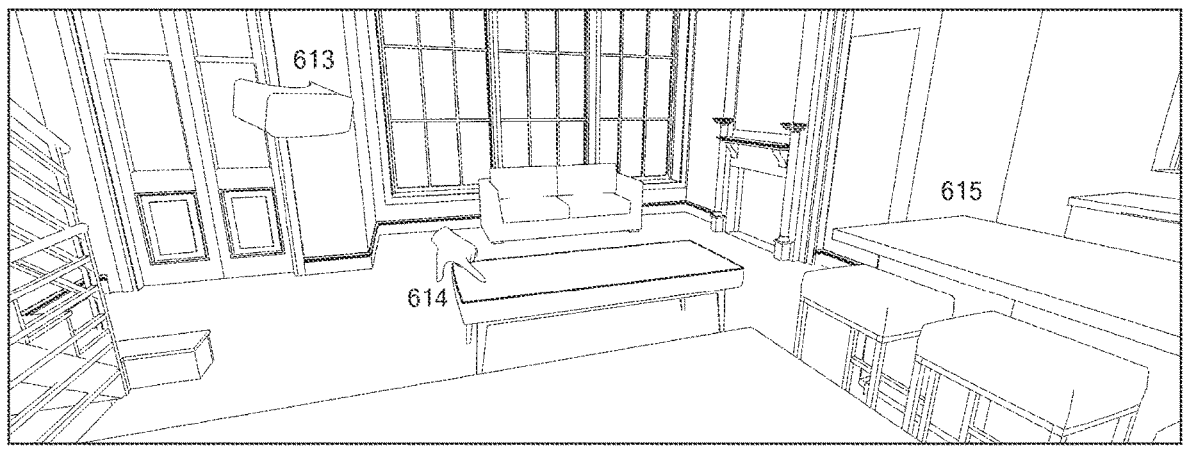
FIG. 6C is an illustration of a VR model environment viewpoint, according to some embodiments.

FIG. 6C is an illustration of a VR model environment viewpoint 615, according to some embodiments. In FIG. 6C, the context displayed in the virtual world has changed. The elements in the virtual world may have moved, scaled, and reoriented, but the spatial relationship between tracked objects is maintained (613 and 614).

This persistently reliable reference to real world positions allows users to safely move around the space without colliding with each other. In situations where a user's line of sight to another user is impeded in the virtual world, such as when the two users are on different sides of a wall in the virtual world, the client may visualize the other user with an alternate representation, such as an outline or an arrow. This alternate representation may be visibly distinct from other objects in the virtual world and may be depicted without regards to any geometry that would obscure it.

Gestures

Figure 7:
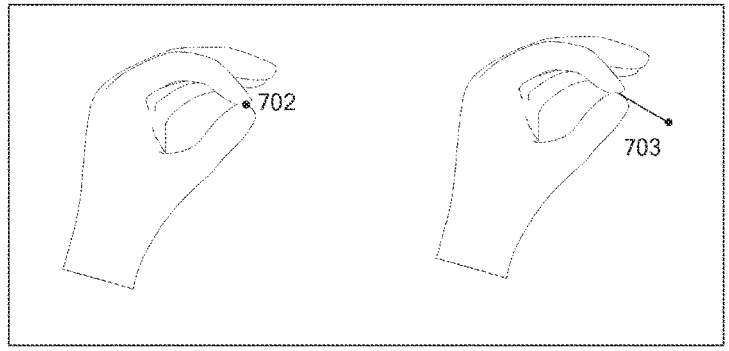
FIG. 7 is a diagram depicting a set of computer-detectable hand gestures, according to some embodiments.
Figure 7:
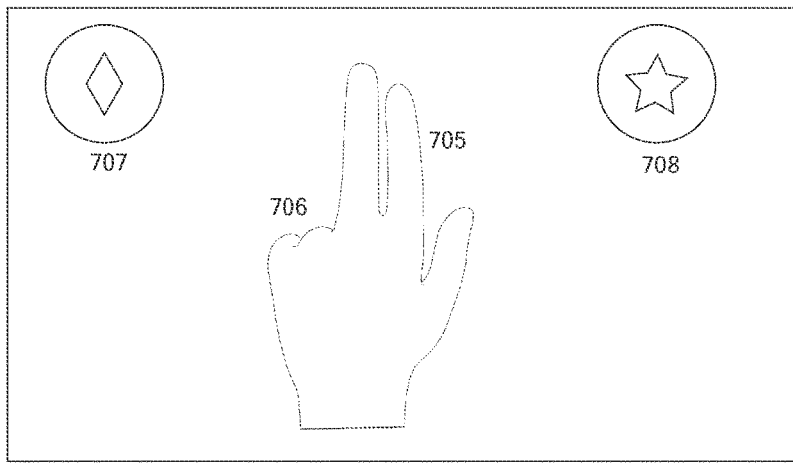
Figure 7:
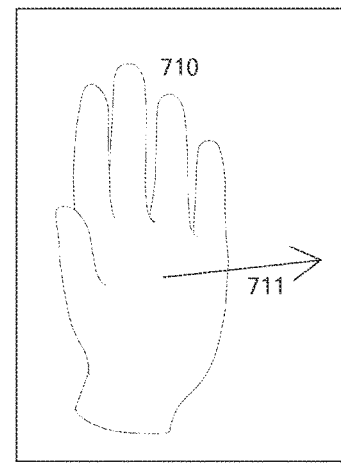
Figure 7:
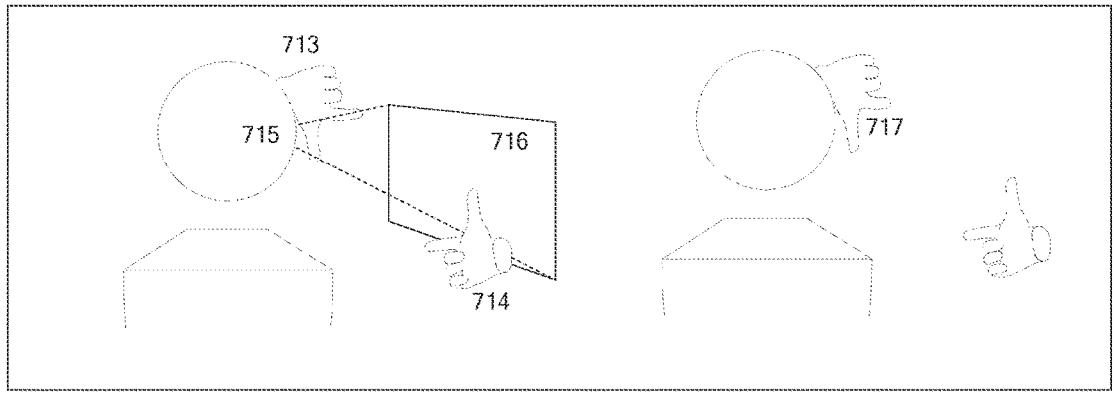

FIG. 7 is a diagram depicting a set of computer-detectable hand gestures, according to some embodiments. FIG. 7 generally shows hands in positions that could be detected by client software to control the simulation state. When a user's hand tracking data is available, client software uses it to calculate whether or not the user's index finger and thumb are touching at the tips. A value representing this condition is explicitly exposed by the Quest SKD. When the client software detects a change from not touching to touching, it considers a "pick" gesture started at the position of contact in 3D space as shown in 702. If the position at which the index finger and thumb touch moves more than 20 mm away from the initial contact point as shown in 703 then the gesture is considered completed. If the index finger is separated from the thumb before that threshold is met, the gesture is considered cancelled. Buttons that exist in virtual space may be operated by this pick gesture. Buttons may have boundaries that define a region of 3D space, either reflecting the visual representation of the button or extending beyond it. Initiating a "pick" inside that boundary may have a visible or audible reaction, analogous to a "rollover" effect common in website user interfaces. Completing the "pick" gesture may activate the button.

Additionally, objects designated as moveable in the virtual space may be "grabbed" by initiating a "pick" in the object's designated bounds. In these situations, the object may not move in the space until the "pick" is moved far enough to be considered completed. At that point, the object would conform to the position of contact between the index finger and the thumb to replicate the movement that had elapsed between initiation and completion of the gesture, and the object will continue to replicate any future movement until contact is lost between the index finger and thumb. In this instance, movement can refer to repositioning of the point of contact, reorienting of the hand, or both.

The "quick" gesture may be initiated when the software detects a hand positioned with the palm pointing roughly away from the user with the index and middle fingers having a low "fold" and "curl" value as shown at 705 (sticking straight up) and the ring and pinky fingers having a high "fold" and "curl" value as shown at 706 (being curled in.) The position of the thumb is disregarded. When this "quick" gesture is initiated, "quick buttons" may appear in 3D space around the index and middle fingers at least 15 cm away from the point of initiation, as shown at 707 and 708. These "quick buttons" are considered activated if the tips of the index and middle fingers enter their designated bounds in 3D space. The gesture is cancelled if the relevant "fold" and "curl" thresholds are not met. Once the gesture is initiated, the orientation of the palm is no longer regarded. Upon cancelling the gesture, all "quick buttons" are hidden and deactivated. Some "quick buttons" may spawn more "quick buttons" when activated. This may hide and deactivate all previous "quick buttons." Any new "quick buttons" may be created in positions weighted towards the point where the gesture was initiated.

The "query" gesture may be initiated when the software detects a hand with the index, middle, ring, and pinky fingers all at a low "fold" and "curl" as displayed in 710. While this gesture is active, the software checks for objects directly in front of the palm as shown in 711 and if those objects have exposed data, a menu panel may appear next to the hand with that data. The displayed menu panel may contain a virtual button users could activate with a "pick" gesture to access some function related to that object. Queryable objects may include objects with vendor and price data, objects that have alternate suggested options, or other users who may have linked profile data such as a business card or a data sheet of likes and dislikes.

The "camera" gesture is shown generally in 712. It is initiated when the software detects that both the user's hands are in an 'L' shape, with the index fingers at a low "fold" and "curl", the middle, ring, and pinky fingers at a high "fold" and "curl", and the thumb held perpendicular to the index finger, and that the two index fingers are pointing in roughly inverse directions, as shown at 713 and 714. If this gesture is maintained with the single exception that one or both of the index fingers' "fold" or "curl" amounts increase past a certain threshold, as shown in 717, the gesture is activated. Any other change in finger position cancels the gesture. When the gesture is activated, the software records the headset position, hand positions, and average index finger orientation such that it can recreate a camera frustum (716) as viewed from the headset's position (715) aligned with the index finger orientation and bounded relative to the hand positions. This data may be used by the software to create a storable image file of the virtual world from a camera with that frustum, or the data can be sent to another client on the network or saved to be processed later.

Menu Panels

When the software detects that a "pick" gesture has been initialized, and the location of the gesture does not lie in the bounds of any existing user interface element, the activation of that gesture will "summon" a user interface menu panel, called the "pop up" menu panel. "Summoning" refers to creating an instance of the panel at the gesture position or moving the existing instance to that position. The menu panel may be rendered in 3D space as a collection of 3D objects or as a collection of 2D objects aligned to a 3D plane. These objects may include buttons that evoke a change in the menu panel or state of the simulation when activated, or design elements such as a background or border.

Figure 8:
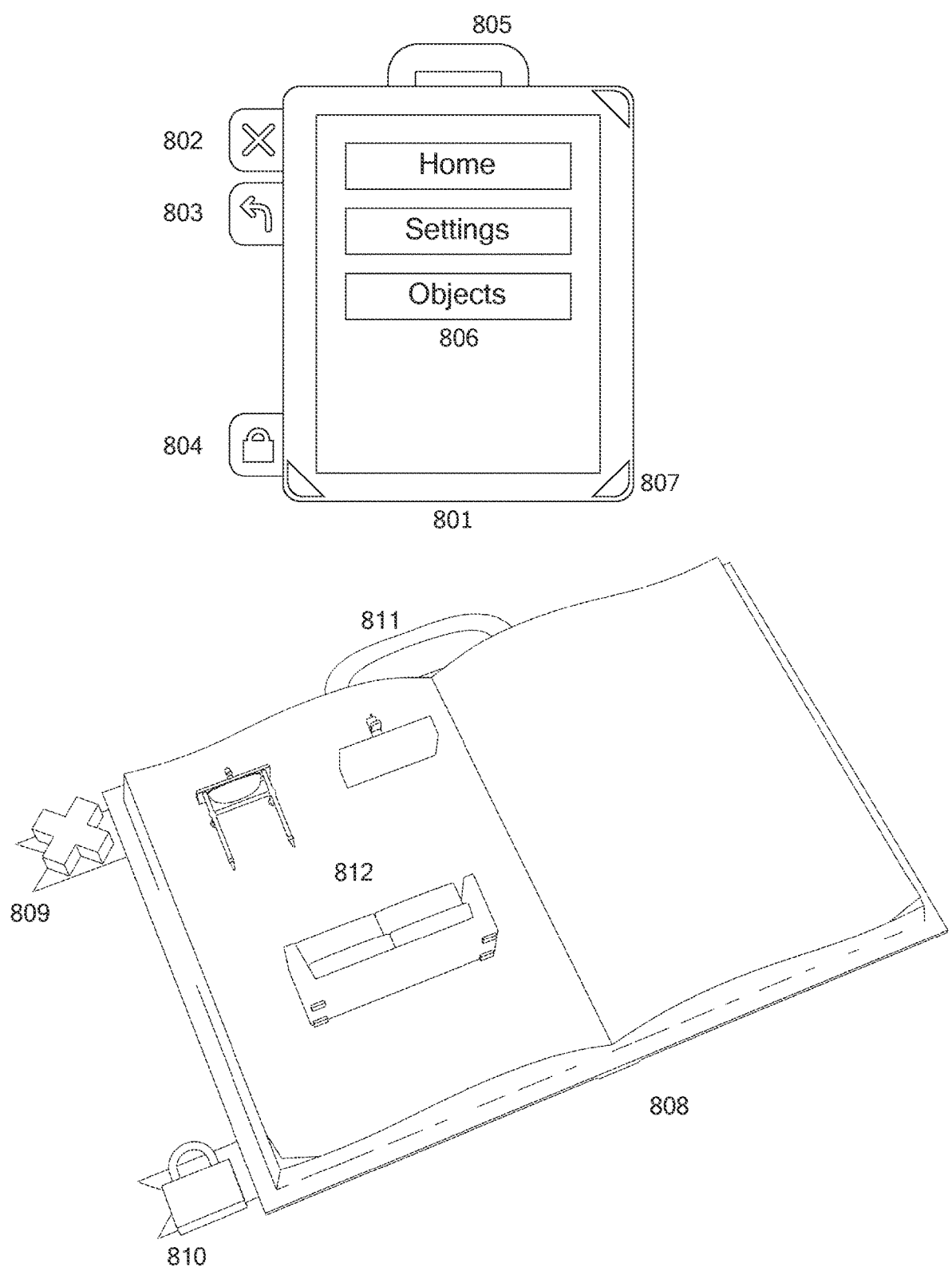
FIG. 8 illustrates a menu panel, according to some embodiments.

FIG. 8 illustrates a menu panel, according to some embodiments. FIG. 8 shows potential interpretations of a menu panel in the shape of a 2D clipboard (801) or a 3D catalog (808). The menu may contain buttons which may be activated through the "pick" gesture. These buttons may perform actions that manipulate the menu itself, such as dismissing the menu (802 and 809) or recalling a previous menu (803). Some buttons may react to the "pick" gesture as a move event, such as using a handle to move the menu in 3D space (805 and 811) or dragging a designated corner (807) to another corner of the menu to "turn the page" by changing which buttons are present in the menu.

The pop up menu may contain buttons that change the state of the software in ways that may include adding, removing, or changing models displayed in the virtual world. These buttons may be identified by text (806) or they may visibly reflect their activation effect, either directly (812) or symbolically. The contents of the menu panel may change depending on the virtual environment displayed by the client at the time and/or the user's position in that virtual environment.

The pop up menu may contain buttons that create new menu panels. This pop up menu panel may grant access to a hierarchy of menu panels that control every changeable aspect of the simulation, including a panel that lists every object in the current virtual environment that has accessible or changeable data.

Client software running on a non-VR terminal may have access to a variation of the pop up menu panel and any other menu panels. These menu panels may be interpreted into a traditional graphical user interface system activated by a keyboard, mouse, or touchscreen.

VR and terminal clients may be set to run in "guided user" mode. Clients in "guided user" mode do not display any user interface elements, although they may internally retain data regarding other user's elements. Additionally, these clients disregard any gestures detected by the user that might otherwise create a user interface element. "Guided users" may experience changes in the simulation state enacted by others. "Guided users" may see other users' hand and finger positions performing gestures but not the user interface elements being interacted with.

Menu panels have a default "locked" variable set to true. Users may change the state of this variable by activating a lock state toggle button (804 and 810), which sends data regarding the menu's lock state to the other clients. When a client receives data that another user's menu has become unlocked, it changes the visualization of that user's menu into a version with interactable button objects, in which activating a button has the effect that it would have had if the original user activated it. Certain actions may still be locked, such as the lock state toggle button itself or buttons that would return to a previous menu that has not been unlocked.

When a client in "guided mode" receives data that a menu panel has been unlocked, the client will display that menu panel and allow the user to interact with it using gestures.

Unlocked menu panels may return to a locked state after a set amount of time, after a set number of button activations, or when users move a set distance away from the menu object. These values may be set through a menu panel accessible through the pop up menu. These settings may be applied to all users as a global change in the simulation state.

Menu panels may exist outside of the standard menu brought up by using the "pick" gesture in empty space. For example, a virtual whiteboard displaying a slideshow may have an accompanying menu panel to advance slides, or a scale model may "rest" on a menu panel allowing users to signify a position in that model. These menus would not be visible to "guided users", although the accompanying elements (in this case a whiteboard and a scale model) would be.

Any buttons present on these menu panels may be able to access buttons with equivalent effects through the pop up menu.

Figure 9:
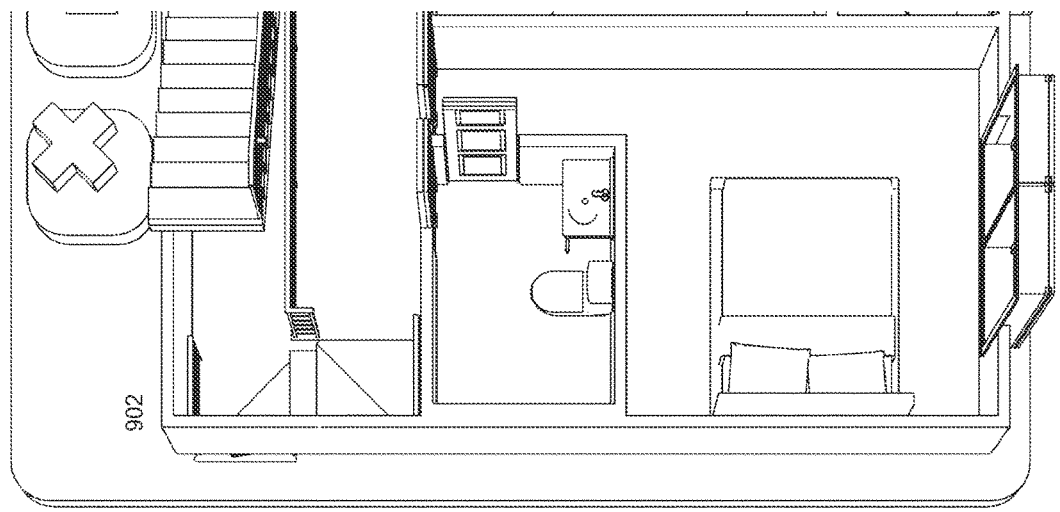
FIG. 9 illustrates a scale model VR interface, according to some embodiments.
Figure 9:
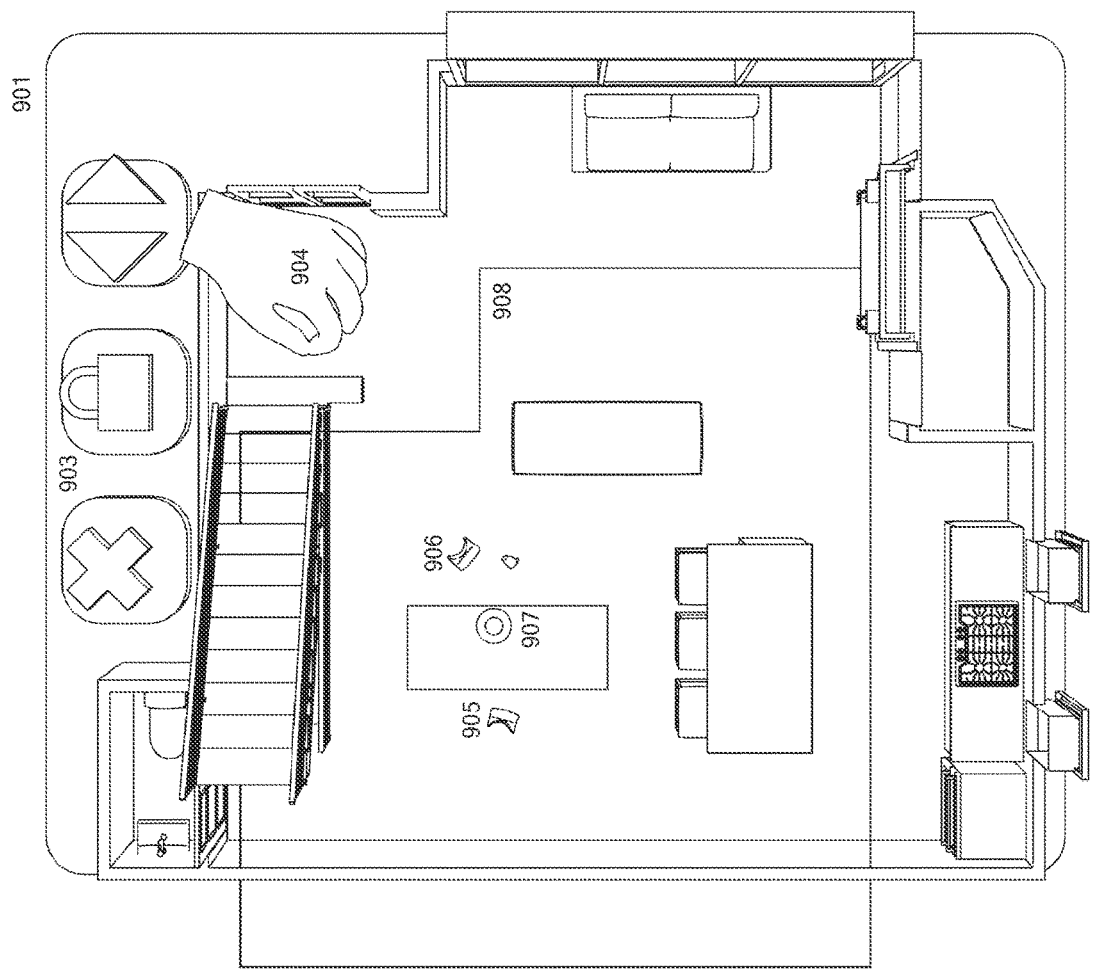

FIG. 9 illustrates a scale model VR interface, according to some embodiments. An example of a scale model interface is shown generally in FIG. 9. Scale models may appear on a menu panel (901). Larger environments or environments with multiple stories may be represented with multiple scale models (902). The scale model may contain a visual representation of the users (905 and 906) to signal where the users might appear in the virtual world, including an indicator that marks the center point between represented users (907). The bounds of the physical containing space may be displayed in the scale model (908). The model may rest on a menu panel with buttons (903) with functions that may include hiding the model, selecting an alternate model, repositioning the model, or transitioning to the virtual environment represented by the model. A user may be able to rotate the model such that it pivots around the indicated center position. This would allow users who approached a real world obstacle to reorient the virtual world, such that they could continue walking through the virtual world by walking away from the real world obstacle. A user may perform the "pick" gesture on the floor of the scale model (904) to initiate transportation to the virtual environment at the position that correlates to that point.

EXAMPLES

In one example, a real estate broker may wish to sell condo units for a building that is still under construction. The real estate broker could enter dimension data from floorplans to create trimmed 3D models of the condos. A designer could place models of furniture in the condos. The agent could then meet with potential buyers and run the simulation software. The agent provides the potential buyers with VR headsets in "guided user" mode. The agent could show various floorplans as scale models in the "presentation room." When the potential buyers react well to a floorplan, the agent could transport the group into the full model of that condo, complete with the staging selected by the designer. Here, the agent and potential buyers can walk around a full scale representation of the condo while pointing, gesturing, and discussing as through they were at the property. When they are ready to see a different model, the agent could wave two fingers in the air and "magically" return the group to the presentation room.

In another example, a manager at a manufacturing plant may wish to train new employees to spot potentially hazardous conditions. The manager could have a slideshow prepared listing potential hazards. The manager could secure a 3D model of the plant and create variations of it in which a different hazard is added to each model. The manager may run the simulation with the new employees. The new employees' VR headsets may be in "guided user" mode. They may all appear together in the "presentation room," where the manager may bring up the slideshow as a board floating in the space. After reviewing the slideshow, the manager may move the group into one of the factory models. The new employees may then walk around the space and look for potential hazards. They could present their findings to the manager, who could evaluate their response and then move the group to a new variation of the model.

In yet another example, a homeowner may be considering a design makeover. A designer could enter basic dimensions of the space to create a reasonably approximate model of the house without having to enter the property. A designer could then decorate the model with paint treatments, furniture, hardware and moulding based on products available from local suppliers. The designer could add additional decorations as alternate suggestions. The designer could make a second version of the model with major structural changes. The designer could then run the simulation with the homeowner. Once they had gotten comfortable to the virtual space, the designer could move them into the model of the space. The designer could bring up a menu panel with color options and demonstrate the pick gesture so that the homeowner could cycle through colors at their own pace. The homeowner could perform the query gesture to learn about individual pieces of furniture selected by the designer. The designer could change to the model with the major structural changes so the homeowner could weigh the cost of the change with the impact of being in the altered space.

Figure 10:
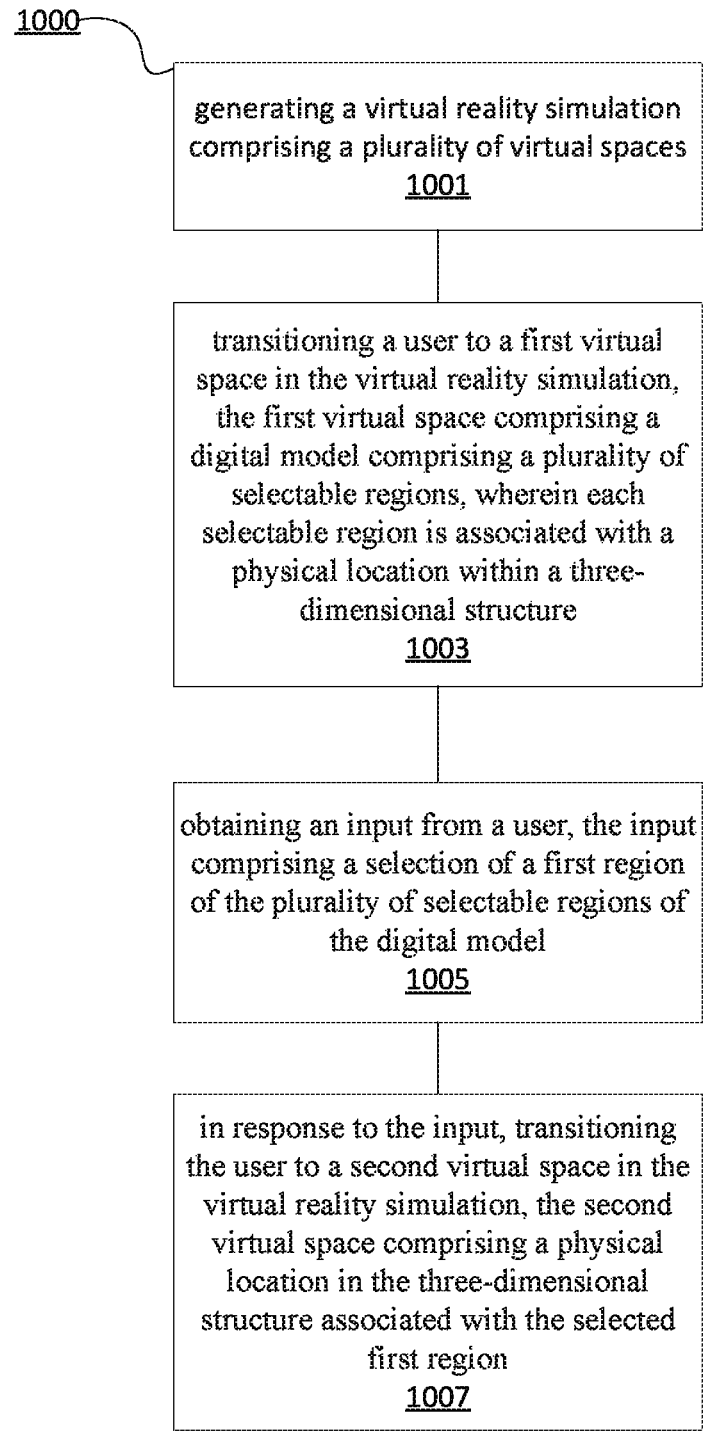
FIG. 10 is a flow diagram, according to some embodiments.

FIG. 10 is a flow diagram, according to some embodiments. Method 1000 of FIG. 10 may be performed by a server (1100) running virtual reality simulation software described herein. Method 1000 may be a method for navigating a virtual reality (VR) simulation. At step 1001, a virtual reality simulation comprising a plurality of virtual spaces is generated. For example, the virtual reality simulation may comprising a Presentation Room virtual space and a full environment model virtual space. At step 1003, a user is transitioned to a first virtual space in the virtual reality simulation, the first virtual space comprising a digital model comprising a plurality of selectable regions, wherein each selectable region is associated with a physical location within a three-dimensional structure. According to some embodiments, the first virtual space comprises the Presentation Room, and the digital model is a three-dimensional scale model of an architecture drawing. At step 1005, an input is obtained from a user, the input comprising a selection of a first region of the plurality of selectable regions of the digital model. In some embodiments, the first region may be, for example, a room, backyard, or other physical space represented by the scale model. At step 1007, in response to the input, the user is transitioned to a second virtual space in the virtual reality simulation, the second virtual space comprising a physical location in the three-dimensional structure associated with the selected first region. For example, the user may be transitioned to a full environment model virtual space, such as a room in a house.

Figure 11:
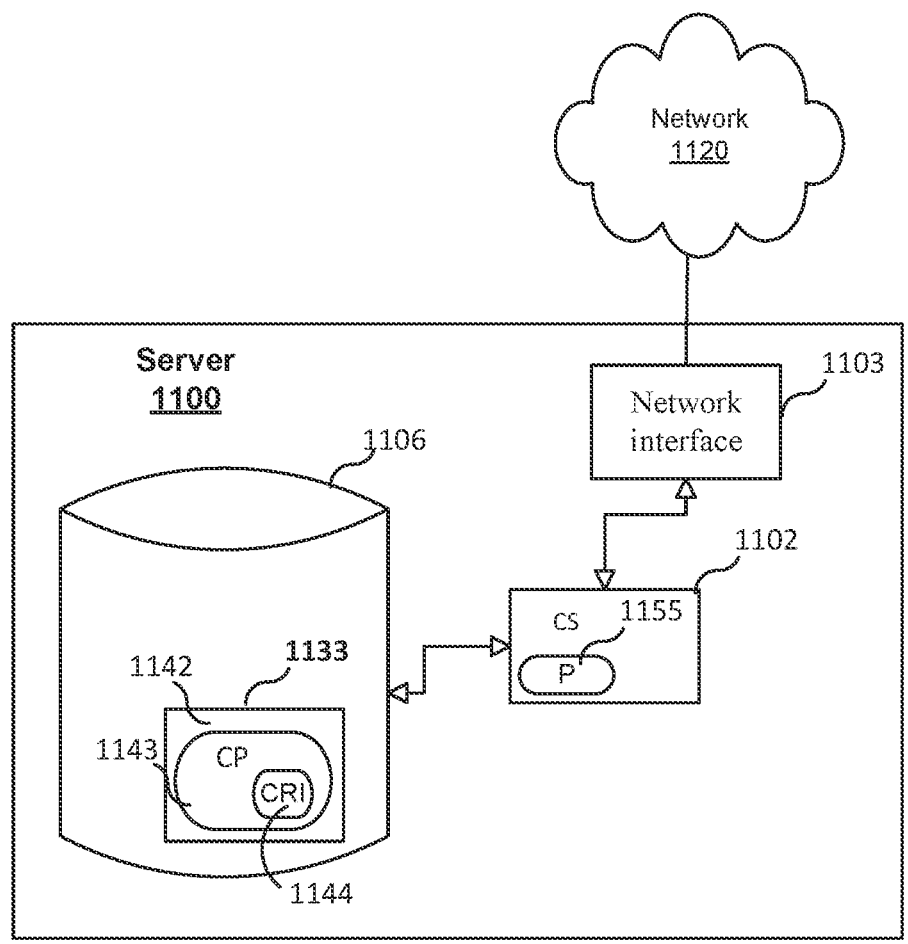
FIG. 11 is a block diagram illustrating a sever, according to some embodiments.

FIG. 11 is a block diagram illustrating a sever 1100, according to some embodiments. As shown in FIG. 11, server 1100 may comprise: a data processing system (DPS) 1102, which may include one or more processors 1255 (e.g., a general purpose microprocessor and/or one or more other data processing circuits, such as an application specific integrated circuit (ASIC), field-programmable gate arrays (FPGAs), and the like); a network interface 1103 for use in connecting server 1100 to network 1120; and local storage unit (a.k.a., "data storage system") 1106, which may include one or more non-volatile storage devices and/or one or more volatile storage devices (e.g., random access memory (RAM)). In embodiments where server 1100 includes a general purpose microprocessor, a computer program product (CPP) 1133 may be provided. CPP 1133 includes a computer readable medium (CRM) 1142 storing a computer program (CP) 1143 comprising computer readable instructions (CRI) 1144. CRM 1142 may be a non-transitory computer readable medium, such as, but not limited, to magnetic media (e.g., a hard disk), optical media (e.g., a DVD), memory devices (e.g., random access memory), and the like. In some embodiments, the CRI 1144 of computer program 1143 is configured such that when executed by data processing system 1102, the CRI causes the server 1100 to perform steps described above (e.g., steps described above with reference to the flow charts). In other embodiments, server 1100 may be configured to perform steps described herein without the need for code. That is, for example, data processing system 1102 may consist merely of one or more ASICs. Hence, the features of the embodiments described herein may be implemented in hardware and/or software.

While various embodiments of the present disclosure are described herein, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

The invention claimed is:

1. A computer-implemented method for navigating a virtual reality (VR) simulation for a first user and a second user occupying a shared real-world environment, the method comprising:
generating a virtual reality simulation comprising a plurality of virtual spaces;
rendering, in a first display of a first user device of the first user, a first virtual space in the virtual reality simulation, the first virtual space comprising a digital model comprising a plurality of selectable regions, wherein each selectable region is associated with a physical location within a three-dimensional structure;
rendering, in the first display, a representation of the second user in the first virtual space, wherein a location and orientation of the representation of the second user in the first virtual space corresponds to a location and orientation of the second user in the shared real-world environment;
rendering, in a second display of a second user device of the second user, the first virtual space in the virtual reality simulation;
rendering, in the second display, a representation of the first user in the first virtual space, wherein a location and orientation of the representation of the first user in the first virtual space corresponds to a location and orientation of the first user in the shared real-world environment;
obtaining an input from the first user or the second user, the input indicating a selection of a first region of the plurality of selectable regions of the digital model, wherein the input is obtained from a position and orientation tracking device capable of tracking a motion of a hand of the first or second user;
in response to the input, rendering, in the first and second display of the first and second user device, a second virtual space in the virtual reality simulation, the second virtual space comprising a physical location in the three-dimensional structure associated with the selected first region; and
capturing a photograph of a portion of the virtual reality simulation in response to detecting a photo gesture from the first or second user, wherein the photo gesture comprises framing a portion of the virtual reality simulation between an L-shaped left hand and L-shaped right hand with one or more of index fingers folded or curled beyond a threshold amount.

2. The method of claim 1, wherein the digital model comprises a three-dimensional scale model of an architectural drawing of a physical structure.

3. The method of claim 2, wherein the first region comprises a room within the scale model of the architectural drawing of the physical structure.

4. The method of claim 2, wherein the physical structure is a manufacturing plant.

5. The method of claim 1, further comprising:
obtaining a second input from the first or second user, the second input indicating an instruction to return to the first virtual space from the second virtual space; and
in response to the second input, rendering, in the first and second display of the first and second user device, the first virtual space in the virtual reality simulation.

6. The method of claim 1, wherein the second virtual space further comprises:
a menu object, the menu object comprising a plurality of options for modifying the three-dimensional structure of the second virtual space.

7. The method of claim 6, wherein the plurality of options comprise at least one of: an option to display furniture in the three-dimensional structure, an option to display the three-dimensional structure with less or more light, an option to display a paint color on a surface in the three-dimensional structure; an option to display the three-dimensional structure in an alternative orientation, or an option to display or modify a moulding pattern on an edge or wall in the three-dimensional structure.

8. The method of claim 6, further comprising:
obtaining a second input from the first or second user, the second input comprising one or more selections made by the first or second user in the virtual simulation, wherein each of the one or more selections comprise at least one of a selected option for modifying the three-dimensional structure or one or more selected photographs of a selected portion of the virtual reality simulation;
aggregating the obtained input into a document; and
outputting the document.

9. A system comprising:
a processor, and a non-transitory computer readable memory coupled to the processor, wherein the processor is configured to:
generate a virtual reality simulation comprising a plurality of virtual spaces;
render, in a first display of a first user device of the first user, a first virtual space in the virtual reality simulation, the first virtual space comprising a digital model comprising a plurality of selectable regions, wherein each selectable region is associated with a physical location within a three-dimensional structure;
render, in the first display, a representation of the second user in the first virtual space, wherein a location and orientation of the representation of the second user in the first virtual space corresponds to a location and orientation of the second user in the shared real-world environment;
render, in a second display of a second user device of the second user, the first virtual space in the virtual reality simulation;
render, in the second display, a representation of the first user in the first virtual space, wherein a location and orientation of the representation of the first user in the first virtual space corresponds to a location and orientation of the first user in the shared real-world environment;
obtain an input from the first user or the second user, the input indicating a selection of a first region of the plurality of selectable regions of the digital model, wherein the input is obtained from a position and orientation tracking device capable of tracking a motion of a hand of the first or second user;
in response to the input, render, in the first and second display of the first and second user device, a second virtual space in the virtual reality simulation, the second virtual space comprising a physical location in the three-dimensional structure associated with the selected first region; and
capture a photograph of a portion of the virtual reality simulation in response to detecting a photo gesture from the first or second user, wherein the photo gesture comprises framing a portion of the virtual reality simulation between an L-shaped left hand and L-shaped right hand with one or more of index fingers folded or curled beyond a threshold amount.

10. The system of claim 9, wherein the digital model comprises a three-dimensional scale model of an architectural drawing of a physical structure.

11. The system of claim 10, wherein the first region comprises a room within the scale model of the architectural drawing of the physical structure.

12. The system of claim 9, wherein the processor is further configured to:
obtain a second input from the first or second user, the second input indicating an instruction to return to the first virtual space from the second virtual space; and
in response to the second input, render, in the first and second display of the first and second user device, the first virtual space in the virtual reality simulation.

13. The system of claim 9, wherein the second virtual space further comprises a menu object, the menu object comprising a plurality of options for modifying the three-dimensional structure of the second virtual space.

14. The system of claim 13, wherein the plurality of options comprise at least one of: an option to display furniture in the three-dimensional structure, an option to display the three-dimensional structure with less or more light, an option to display a paint color on a surface in the three-dimensional structure; an option to display the three-dimensional structure in an alternative orientation, or an option to display or modify a moulding pattern on an edge or wall in the three-dimensional structure.

15. The system of claim 14, wherein the processor is further configured to:
obtain a second input from the first or second user, the second input comprising one or more selections made by the first or second user in the virtual simulation, wherein each of the one or more selections comprise at least one of a selected option for modifying the three-dimensional structure, or one or more selected photographs of a selected portion of the virtual reality simulation;
aggregate the obtained input into a document; and
output the document.

16. The system of claim 9, wherein the input is obtained from a position and orientation tracking device capable of tracking a motion of a hand of the first or second user.

17. A computer-implemented method for navigating a virtual reality (VR) simulation for a first user and a second user occupying a shared real-world environment, the method comprising:
generating a virtual reality simulation comprising a plurality of virtual spaces;
rendering, in a first display of a first user device of the first user, a first virtual space in the virtual reality simulation, the first virtual space comprising a digital model comprising a plurality of selectable regions, wherein each selectable region is associated with a physical location within a three-dimensional structure;
rendering, in the first display, a representation of the second user in the first virtual space, wherein a location and orientation of the representation of the second user in the first virtual space corresponds to a location and orientation of the second user in the shared real-world environment;
rendering, in a second display of a second user device of the second user, the first virtual space in the virtual reality simulation;
rendering, in the second display, a representation of the first user in the first virtual space, wherein a location and orientation of the representation of the first user in the first virtual space corresponds to a location and orientation of the first user in the shared real-world environment;
obtaining an input from the first user or the second user, the input indicating a selection of a first region of the plurality of selectable regions of the digital model, wherein the input is obtained from a position and orientation tracking device capable of tracking a motion of a hand of the first or second user; and in response to the input, rendering, in the first and second display of the first and second user device, a second virtual space in the virtual reality simulation, the second virtual space comprising a physical location in the three-dimensional structure associated with the selected first region, wherein the input is obtained by an index finger and a thumb of the first or second user touching to form a pinch gesture, and continuing to touch as the index finger and thumb are dragged a set distance.

* * * * *